United States Patent
Park et al.

(10) Patent No.: US 10,437,518 B2
(45) Date of Patent: Oct. 8, 2019

(54) MEMORY SYSTEM AND METHOD OF OPERATING THE SAME

(71) Applicant: SK hynix Inc., Gyeonggi-do (KR)

(72) Inventors: Min Kyu Park, Gyeonggi-do (KR); Soo Jin Wi, Gyeonggi-do (KR); Deung Kak Yoo, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/936,652

(22) Filed: Mar. 27, 2018

(65) Prior Publication Data
US 2019/0056887 A1 Feb. 21, 2019

(30) Foreign Application Priority Data
Aug. 18, 2017 (KR) .................... 10-2017-0104902

(51) Int. Cl.
| | |
|---|---|
| *G11C 5/14* | (2006.01) |
| *G06F 3/06* | (2006.01) |
| *G11C 16/10* | (2006.01) |
| *G11C 11/56* | (2006.01) |
| *G11C 16/26* | (2006.01) |
| *G11C 16/28* | (2006.01) |
| *G11C 16/30* | (2006.01) |

(52) U.S. Cl.
CPC .......... *G06F 3/0659* (2013.01); *G06F 3/0604* (2013.01); *G06F 3/0679* (2013.01); *G11C 11/5628* (2013.01); *G11C 16/10* (2013.01); *G11C 5/144* (2013.01); *G11C 11/5642* (2013.01); *G11C 16/26* (2013.01); *G11C 16/28* (2013.01); *G11C 16/30* (2013.01)

(58) Field of Classification Search
None
See application file for complete search history.

(56) References Cited

U.S. PATENT DOCUMENTS

| | | | | |
|---|---|---|---|---|
| 2013/0103887 | A1* | 4/2013 | Frey | ......... G06F 9/442 711/103 |
| 2016/0300609 | A1* | 10/2016 | Han | ......... G11C 16/26 |
| 2017/0169883 | A1* | 6/2017 | Kwon | ......... G11C 7/14 |

FOREIGN PATENT DOCUMENTS

| | | |
|---|---|---|
| KR | 1020080035828 | 4/2008 |
| KR | 1020150130633 | 11/2015 |

* cited by examiner

*Primary Examiner* — Uyen B Tran
(74) *Attorney, Agent, or Firm* — IP & T Group LLP

(57) ABSTRACT

Provided herein may be a memory system and a method of operating the same. The memory system may include a controller configured to generate and output a first command for a program operation in response to a request from a host, and generate and output a second command for a read scan operation when the memory system is powered on after an abnormal power-off is detected; and a semiconductor memory device configured to perform the program operation on a page basis in response to the first command, perform the read scan operation in response to the second command, and perform a single read operation per page using a set read voltage during the read scan operation.

19 Claims, 6 Drawing Sheets

MEMORY SYSTEM AND METHOD OF OPERATING THE SAME

CROSS-REFERENCE TO RELATED APPLICATION

The present application claims priority under 35 U.S.C. § 119(a) to Korean patent application number 10-2017-0104902, filed on Aug. 18, 2017, which is incorporated herein by reference in its entirety.

BACKGROUND

1. Field of Invention

Various embodiments of the present disclosure relate to an electronic device, and more particularly, to a memory system including a nonvolatile memory device and a method of operating the same.

2. Description of the Related Art

Recently, the computing environment paradigm has been transitioning into ubiquitous computing, in which computer systems can be used anytime and anywhere. As a result, the use of portable electronic devices such as mobile phones, digital cameras, and laptop computers has rapidly increased. In general, such portable electronic devices use a memory system which includes a memory device, in other words, a data storage device. The data storage device may be used as a main memory device or an auxiliary memory device of the portable electronic devices.

Since a data storage device using a memory device has no mechanical driving part, it may provide various advantages such as excellent stability and durability, high information access speed, and low power consumption. Data storage devices, as an example of the memory system having such advantages, include a universal serial bus (USB) memory device, memory cards having various interfaces, and a solid state drive (SSD).

SUMMARY

Various embodiments of the present disclosure are directed to a memory system which may rapidly search for an erase page to perform a recovery operation when the memory system is re-powered on after sudden power-off (SPO) has occurred during an operation of the memory system, and a method of operating the same.

An embodiment of the present disclosure may provide for a memory system including: a controller configured to generate and output a first command for a program operation in response to a request from a host, and generate and output a second command for a read scan operation when the memory system is powered on after an abnormal power-off is detected; and a semiconductor memory device configured to perform the program operation on a page basis in response to the first command, perform the read scan operation in response to the second command, and perform a single read operation per page using a set read voltage during the read scan operation.

An embodiment of the present disclosure may provide for a memory system including: a semiconductor memory device configured to perform a program operation on a page basis in response to a first command, and perform a read scan operation in response to a second command when the memory system is powered on after an abnormal power-off; a sudden power-off sensor configured to sense the abnormal power-off and the power-on; and a command generator configured to generate and output the first command for the program operation in response to a request from a host, and generate and output the second command when the power-on is sensed by the sudden power-off sensor after the abnormal power-off. The semiconductor memory device may perform the read scan operation using a set read voltage.

An embodiment of the present disclosure may provide for a method of operating a memory system, including: programming random data to a selected memory block on a page basis; performing a read scan operation when the memory system is powered on after sudden power-off is sensed, the read scan operation including searching for a first erase page of pages of the selected memory block using a set read voltage; and re-performing, from the searched first erase page, the programming interrupted when the sudden power-off occurred.

DETAILED DESCRIPTION

Figure 1:
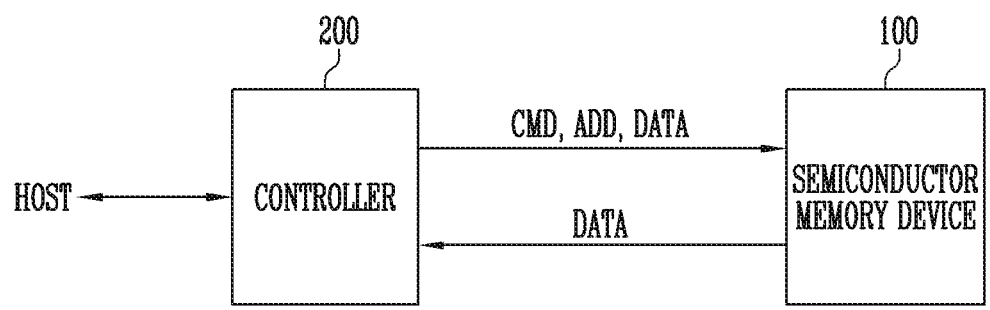
FIG. 1 is a block diagram illustrating a memory system in accordance with an embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present.

Hereinafter, embodiments will be described with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as "first" and "second" may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, "and/or" may include any one of or a combination of the components mentioned.

Furthermore, a singular form may include a plural from as long as it is not specifically mentioned in a sentence. It will be further understood that the terms "comprises," "comprising," "includes," and "including" when used in this specification, specify the presence of the stated elements and do not preclude the presence or addition of one or more other elements.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

Figure 2:
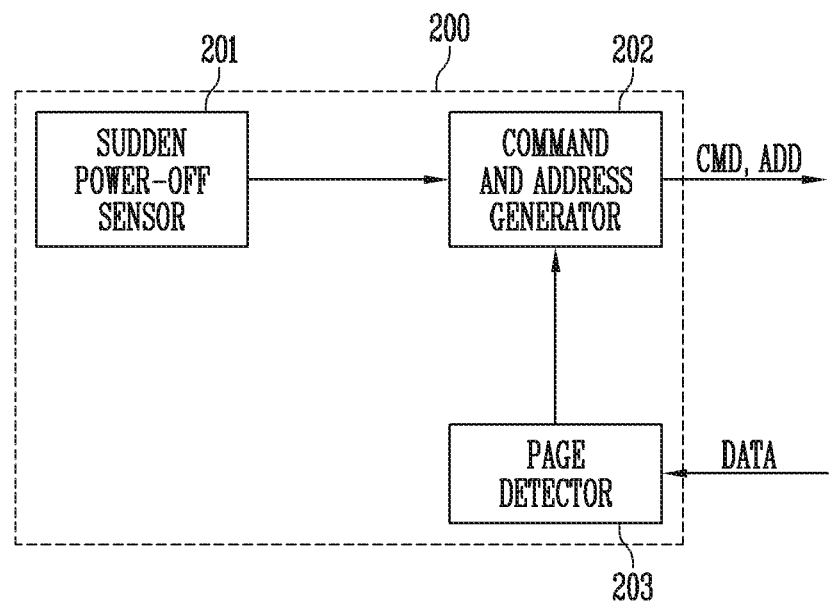
FIG. 2 is a block diagram illustrating a controller shown in FIG. 1.

FIG. 1 is a block diagram illustrating a memory system 300 in accordance with an embodiment of the present disclosure. FIG. 2 is a block diagram illustrating a controller 200 shown in FIG. 1.

Referring to FIG. 1, the memory system 300 may include a semiconductor memory device 100, and the controller 200 configured to control the operation of the semiconductor memory device 100 in response to a request from a host.

The semiconductor memory device 100 may perform a program operation or a read operation on memory cells of pages included in a memory block in response to a command CMD and an address ADD that are received from the controller 200. The semiconductor memory device 100 may program data DATA input from the controller 200 to memory cells of a target program page and outputs data DATA read from the memory cells to the controller 200.

Referring to FIG. 2, the controller 200 may include a sudden power-off sensor 201, a command and address generator 202, and a page detector 203.

The sudden power-off sensor 201 senses that a sudden power off occurs during a program operation in the memory system 300, and generates a sense signal when the memory system 300 is powered on.

The command and address generator 202 generates, in response to a sense signal received from the sudden power-off sensor 201, a command CMD and an address ADD to perform a read scan operation on a memory block (referred to as an interrupted memory block) on which a program operation has been interrupted by the sudden power off. The read scan operation may be performed on the interrupted memory block in reverse order of a program operation to pages in the interrupted memory block.

Furthermore, the command and address generator 202 may generate and output a command CMD and an address ADD to resume the interrupted program operation from a first erase page of a selected memory block of the semiconductor memory device 100 that is detected by the page detector 203. Alternatively, the command and address generator 202 may generate and output a command CMD and an address ADD to resume the interrupted program operation in a sequence from an erase page subsequent to the first erase page of the selected memory block of the semiconductor memory device 100 that is detected by the page detector 203.

The page detector 203 detects a target program page on which the interrupted program operation is to be resumed after the sudden power off, among pages of the memory block on which the program operation has been interrupted by the sudden power off, based on data read from the semiconductor memory device 100 by the read scan operation. Here, the target program page may be a first erase page according to the order of the read scan operation to the pages of the interrupted memory block. The page detector 203 detects a first page in which no data is stored, among the pages of the memory block on which the program operation has been interrupted by the sudden power off, as the first erase page.

Figure 3:
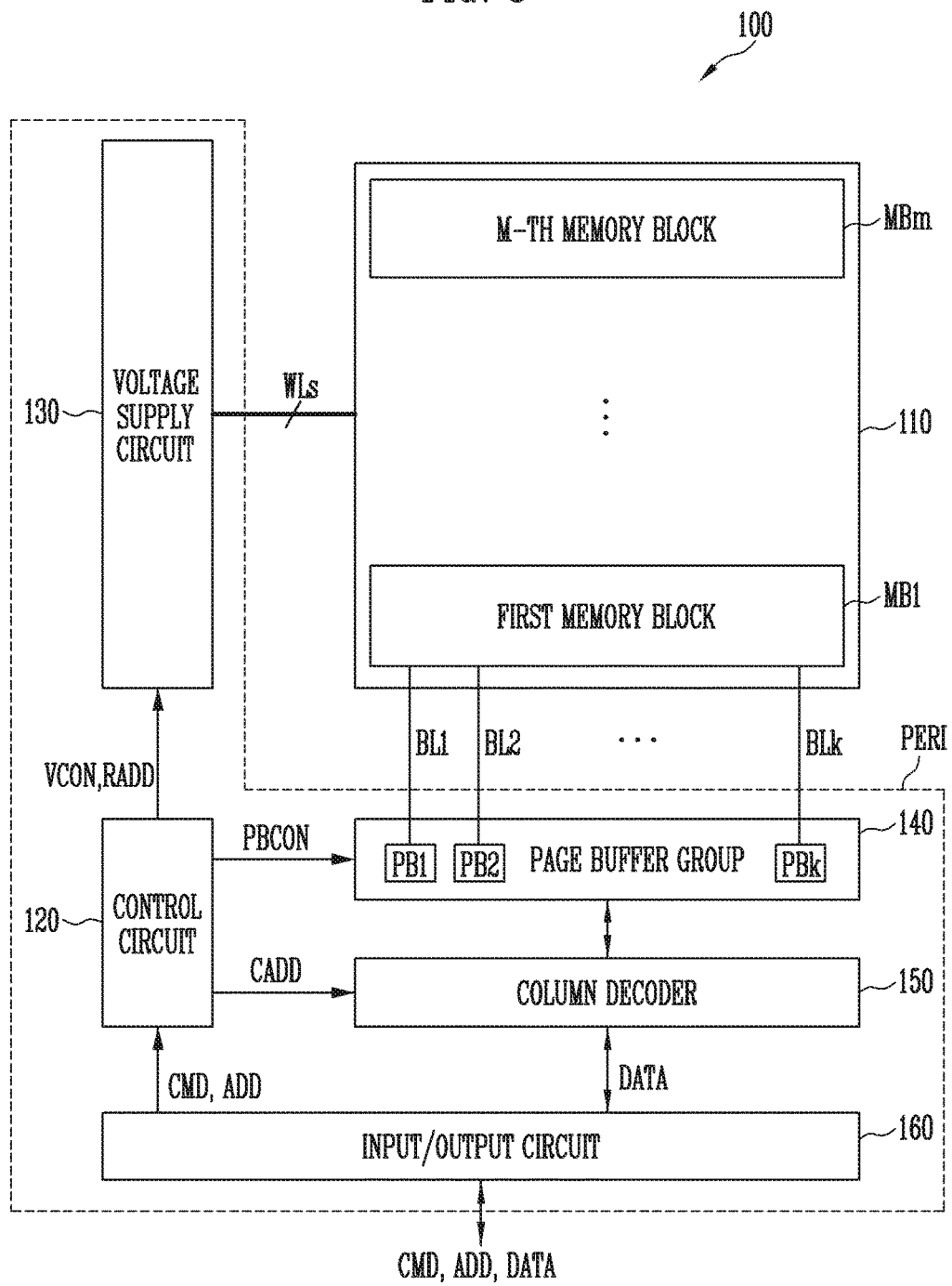
FIG. 3 is a block diagram illustrating a semiconductor memory device shown in FIG. 1.
Figure 4:
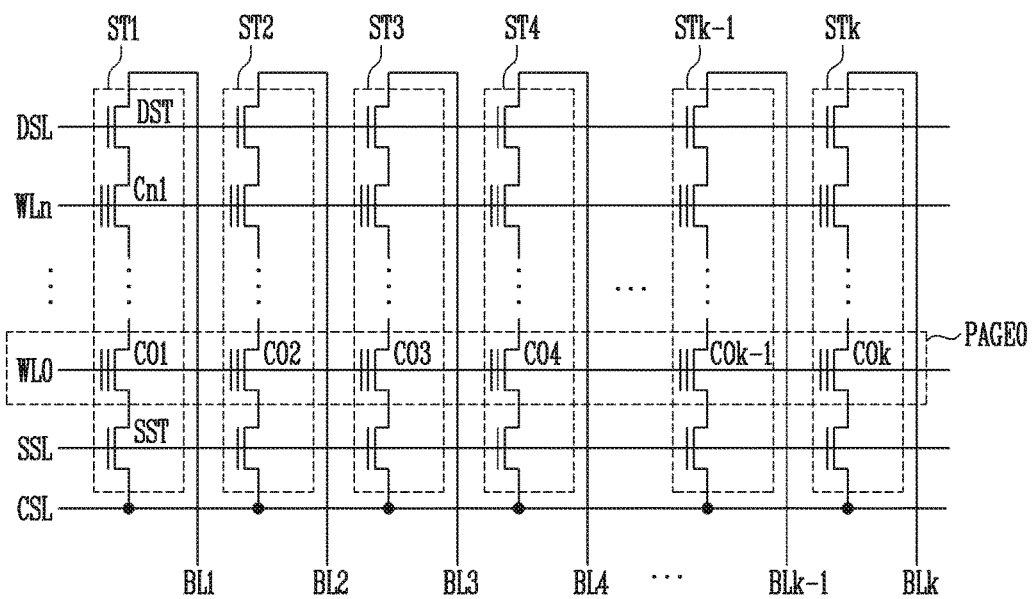
FIG. 4 is a circuit diagram illustrating a memory block shown in FIG. 3.

FIG. 3 is a block diagram illustrating the semiconductor memory device 100 shown in FIG. 1. FIG. 4 is a circuit diagram illustrating a memory block shown in FIG. 3.

Referring to FIG. 3, the semiconductor memory device 100 according to an embodiment of the present disclosure may include a memory array 110 including first to m-th memory blocks MB1 to MBm, and a peripheral circuit PERI configured to perform a program operation and a read operation of memory cells included in a selected page of the memory blocks MB1 to MBm. The peripheral circuit PERI includes a control circuit 120, a voltage supply circuit 130, a page buffer group 140, a column decoder 150, and an input/output circuit 160.

Referring to FIG. 4, each memory block includes a plurality of strings ST1 to STk which are coupled between bit lines BL1 to BLk and a common source line CSL. In other words, the strings ST1 to STk are respectively coupled to the bit lines BL1 to BLk and are coupled in common to the common source line CSL. Each string, e.g., ST1, includes a source select transistor SST having a source coupled to the common source line CSL, a plurality of memory cells C01 to Cn1, and a drain select transistor DST having a drain coupled to a corresponding bit line BL1. The memory cells C01 to Cn1 are coupled in series between the select transistors SST and DST. A gate of the source select transistor SST may be coupled to the source select line SSL. Gates of the memory cells C01 to Cn1 may be respectively coupled to the word lines WL0 to WLn. A gate of the drain select transistor DST may be coupled to the drain select line DSL.

The memory cells included in the memory block may be divided into physical page units or logical page units. For example, memory cells C01 to C0$k$ coupled to a single word line (e.g., WL0) form a single physical page PAGE0. Each page is the basic unit of a program or read operation.

Referring back to FIG. 3, the control circuit 120 outputs a voltage control signal VCON to generate a voltage required for performing a program or read operation in response to a command CMD input from an external device through the input/output circuit 160, and outputs a PB control signal PBCON for controlling page buffers PB1 to PBk included in the page buffer group 140 depending on the kind of operation. Furthermore, the control circuit 120 outputs a row address signal RADD and a column address signal CADD in response to an address signal ADD input from the external device through the input/output circuit 160.

The voltage supply circuit 130 supplies operating voltages required for a program operation, a read operation, and an erase operation of the memory cells to local lines including the drain select line DSL, the word lines WL0 to WLn, and the source select line SSL of a selected memory block, in response to a voltage control signal VCON from the control circuit 120. The voltage supply circuit 130 includes a voltage generation circuit and a row decoder.

The voltage generation circuit outputs the operating voltages required for the program operation, the read operation, or the erase operation of the memory cells to global lines, in response to the voltage control signal VCON from the control circuit 120.

The row decoder couples, in response to row address signals RADD from the control circuit 120, the global lines to the local lines DSL, WL0 to WLn, and SSL such that the operating voltages output from the voltage supply circuit to the global lines are transmitted to the local lines DSL, WL0 to WLn, and SSL of the selected memory block in the memory array 110.

The page buffer group 140 includes a plurality of page buffers PB1 to PBk which are coupled to the memory array 110 through the bit lines BL1 to BLk. The page buffers PB1 to PBk of the page buffer group 140 selectively precharge the bit lines BL1 to BLk depending on data to be input and stored to the memory cells C01 to C0$k$ in response to a PB control signal PBCON of the control circuit 120, or sense voltages of the bit lines BL1 to BLk to read data from the memory cells.

The column decoder 150 selects the page buffers PB1 to PBk included in the page buffer group 140 in response to a column address signal CADD output from the control circuit 120. In other words, the column decoder 150 successively transmits data to be stored in the memory cells to the page buffers PB1 to PBk in response to a column address signal CADD. Furthermore, the column decoder 150 successively selects the page buffers PB1 to PBk in response to a column address signal CADD such that data of the memory cells latched to the page buffers PB1 to PBk may be output to the external device during a read operation.

The input/output circuit 160 transmits, during a program operation, data input from the external device and to be stored in the memory cells to the column decoder 150 under the control of the control circuit 120 so that the data is input to the page buffer group 140. When the column decoder 150 transmits data provided from the input/output circuit 160 to the page buffers PB1 to PBk of the page buffer group 140, each of the page buffers PB1 to PBk stores the corresponding input data to a latch circuit included therein. In addition, during a read operation, the input/output circuit 160 outputs, to the external device, data transmitted from the page buffers PB1 to PBk of the page buffer group 140 through the column decoder 150.

When the controller 200 of FIG. 1 senses that the memory system 300 that has been involved in a sudden power off is powered on again, the peripheral circuit PERI of the semiconductor memory device, according to an embodiment of the present disclosure, may perform a read scan operation on an interrupted memory block, in which a program operation has been interrupted.

The peripheral circuit PERI sequentially reads, during the read scan operation, a plurality of pages of the interrupted memory block on which the program operation has been being performed, and outputs the read data to the controller 200 of FIG. 1. Here, the peripheral circuit PERI sequentially reads the pages using a single set read voltage. In an embodiment, the set read voltage is a value between threshold voltage distributions located in the middle of a plurality of program states.

A detailed method of operating the semiconductor memory device during the read scan operation will be described below.

Figure 5:
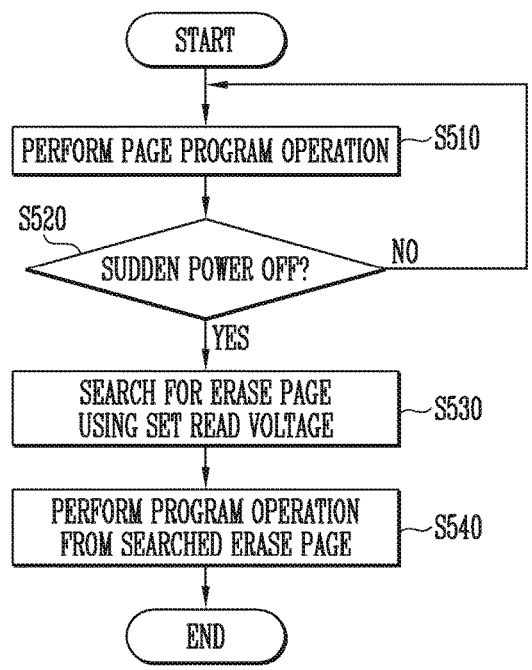
FIG. 5 is a flowchart illustrating a method of operating a memory system in accordance with an embodiment of the present disclosure.

FIG. 5 is a flowchart illustrating a method of operating a memory system in accordance with an embodiment of the present disclosure.

Figure 6:
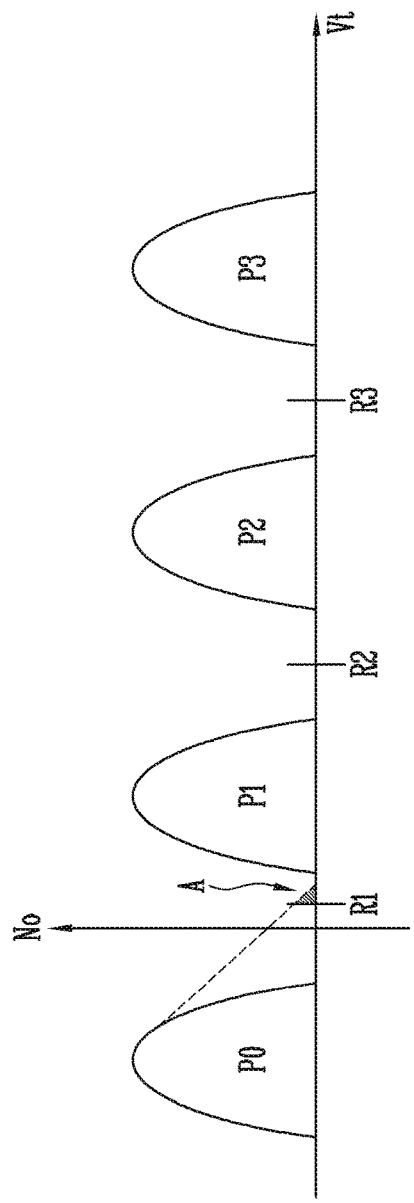
FIGS. 6 and 7 are threshold voltage distribution diagrams illustrating a set read voltage in accordance with an embodiment of the present disclosure.
Figure 7:
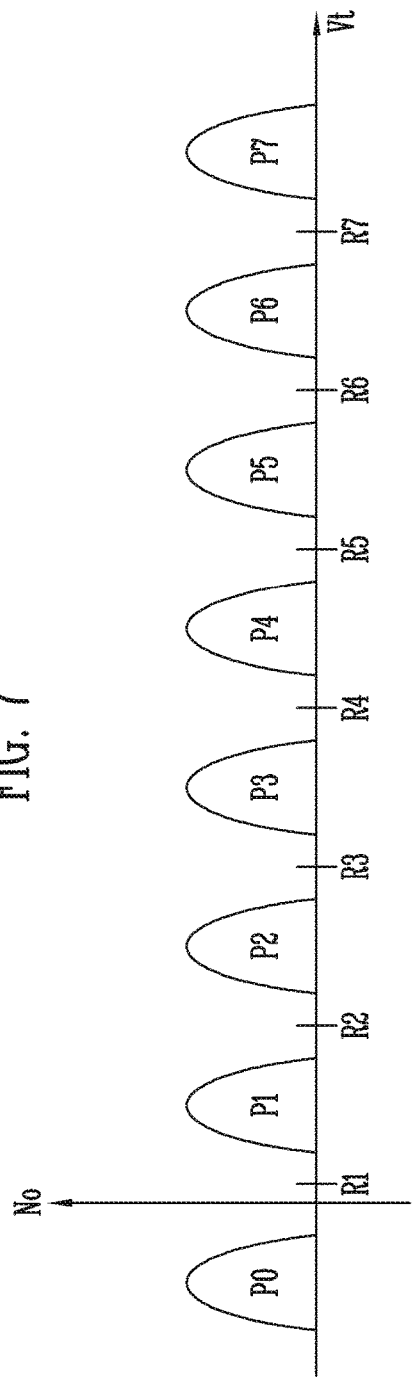

FIGS. 6 and 7 are threshold voltage distribution diagrams illustrating a set read voltage in accordance with an embodiment of the present disclosure.

A method of operating a memory system according to an embodiment of the present disclosure will be described with reference to FIGS. 1 to 7.

In response to a request from the host, the controller 200 outputs a command CMD, an address ADD, and data DATA corresponding to a program operation to the semiconductor memory device 100.

At step S510, the semiconductor memory device 100 programs data in a page program manner to a selected memory block (e.g., MB1) among the first to m-th memory blocks MB1 to MBm included in the memory array 110, in response to the command CMD, the address ADD and the data DATA received from the controller 200. The controller 200 generates data DATA by randomizing data input from the host and to be programmed, and outputs the randomized data DATA to the semiconductor memory device 100.

The program operation of the semiconductor memory device 100 will be described in detail below.

The control circuit 120 outputs a column address signal CADD for controlling the column decoder 150 in response to the command CMD and the address ADD received from the controller 200 through the input/output circuit 160. The column decoder 150 selects the page buffers PB1 to PBk included in the page buffer group 140 in response to the column address signal CADD output from the control circuit 120, and sequentially transmits the data DATA input through the input/output circuit 160 to the page buffers PB1 to PBk in response to the column address signal CADD.

The control circuit 120 outputs a PB control signal PBCON for controlling the page buffers PB1 to PBk included in the page buffer group 140 in response to the command CMD received from the controller 200. Each of the page buffers PB1 to PBk included in the page buffer group 140 temporarily stores the data DATA input through the column decoder 150 in response to the PB control signal PBCON, and controls the potential level of a corresponding one of the bit lines BL1 to BLk in response to the temporarily stored data DATA. For example, when the temporarily stored data DATA corresponds to a program cell, each of the page buffers PB1 to PBk applies a program enable voltage (e.g., 0V) to a corresponding bit line. When the temporarily stored data DATA corresponds to an erase cell, each of the page buffers PB1 to PBk applies a program inhibit voltage Vcc) to a corresponding bit line.

The control circuit 120 outputs a voltage control signal VCON to generate a voltage, e.g., a program voltage, and a pass voltage, required for performing a program operation, in response to a command CMD received from the controller 200.

The voltage supply circuit 130 performs the program operation by supplying operating voltages required for the program operation of the memory cells to the local lines including the drain select line DSL, the word lines WL0 to WLn, and the source select line SSL of a selected memory block (e.g. MB1) in response to the voltage control signal VCON of the control circuit 120. For example, the voltage supply circuit 130 performs the program operation on a selected page PAGE0 by applying a program voltage to a selected word line (e.g., WL0) of the word lines WL0 to WLn and applying a pass voltage to the other unselected word lines WL1 to WLn.

The program operation is performed on a page basis. After the program operation on the selected page has been completed, a program operation is performed on a subsequent page. In other words, a plurality of pages included in a selected memory block are successively selected and programmed.

The sudden power-off sensor 201 of the controller 200 checks whether sudden power off has occurred in the memory system 300, at step S520.

If the memory system 300 is powered on after the sudden power off has occurred (that is, 'YES' at step S520), the controller 200 may control the semiconductor memory device 100 to search for an erase page using a set read voltage, at step S530.

The command and address generator 202 of the controller 200 generates, in response to a sense signal received from the sudden power-off sensor 201, a command CMD and an address ADD to perform a read scan operation on an interrupted memory block on which the program operation has been interrupted by the sudden power off.

The semiconductor memory device 100 performs, in response to the command CMD and the address ADD, a read scan operation for searching for a first erase page on which the interrupted program operation is to be resumed after the sudden power off has occurred, among pages of the interrupted memory block on which the program operation has been interrupted by the sudden power off.

The semiconductor memory device 100 performs read scan operations in a sequence from a first page PAGE0 of a selected memory block (e.g., MB1) to a last page. Here, the semiconductor memory device 100 performs only one read operation using a set read voltage during the read operation of each page. The read scan operation may be performed on the interrupted memory block in reverse order of a program operation to pages in the interrupted memory block.

Referring to FIG. 6, when memory cells are programmed in a multi level cell (MLC) program manner, there are threshold voltage distributions of program states P0 to P3, wherein the program state P0 represents an erase state. In other words, the memory cells are programmed such that each memory cell has any one of four program states. Because data DATA input during a program operation of the semiconductor memory device 100 is randomized by the controller 200, each of the memory cells included in each page PAGE is programmed to have any one of the four program states P0 to P3 including an erase state (i.e., the program state P0), and the memory cells corresponding to each program state are evenly distributed. Therefore, when a read scan operation is performed with a median voltage R2 of the program states P1 and P2 that are distributed in the middle of the four program states P0 to P3, program cells of the program states P0 and P1 and program cells of the program states P2 and P3 are read at a substantially equal ratio in the case of a programmed page. As described above, the program cells of the program states P0 and P1 may include erase cells of the program state P0. On the other hand, when a read scan operation is performed with the median voltage R2, only erase cells of the program state P0 are read in the case of an erase page. As a result, it is possible to check whether a corresponding page is a programmed page or an erase page. Therefore, when the semiconductor memory device 100 is programmed in the multi level cell (MLC) program manner, during a read scan operation, the median voltage R2 of the threshold voltage distributions in which the program states are distributed is set as the set read voltage.

If a voltage R1 lower than the median voltage R2 is set as the set read voltage, cells A having threshold voltages higher than the voltage R1 due to abnormal threshold voltage distribution among cells in the erase state P0 are read as a program state. Consequently, an error in the read scan operation may occur.

Referring to FIG. 7, when memory cells are programmed in a triple level cell (TLC) program manner, there are threshold voltage distributions of program states P0 to P7, wherein the program state P0 represents an erase state. In other words, the memory cells are programmed such that each memory cell has any one of eight program states. Because data DATA input during a program operation of the semiconductor memory device 100 is randomized by the controller 200, each of the memory cells included in each page PAGE is programmed to have any one of the eight program states P0 to P7 including an erase state (i.e., the program state P0), and the memory cells corresponding to each program state are evenly distributed. Therefore, when a read scan operation is performed with a median voltage R4 of the program states P3 and P4 that are distributed in the middle of the eight program states P0 to P7, program cells of the program states P0 to P3 and program cells of the program states P4 and P7 are read at a substantially equal ratio in the case of a programmed page. As described above, the program cells of the program states P0 to P3 may include erase cells of the program state P0. On the other hand, when a read scan operation is performed with the median voltage R4, only erase cells of the program state P0 are read in the case of an erase page. As a result, it is possible to check whether a corresponding page is a programmed page or an erase page. Therefore, when the semiconductor memory device 100 is programmed in the triple level cell (TLC) program manner, during a read scan operation, the median voltage R4 of the threshold voltage distributions in which the program states are distributed is set as a set read voltage.

Referring back to FIG. 5, the page detector 203 of the controller 200 may receive data DATA as the result of the read scan operation of the semiconductor memory device 100, and detect a first erase page of the interrupted memory block of the semiconductor memory device 100. For example, the page detector 203 successively receives data DATA as the result of the read scan operation of each of the pages included in the interrupted memory block, detects as a first erase page a first page of which the number of data DATA corresponding to an erase cell among the input data DATA is a preset value or more.

The command and address generator 202 of the controller 200 selects a target program page on which the interrupted program operation is to be resumed after the sudden power off has occurred, among the pages of the interrupted memory block on which the program operation has been interrupted by the sudden power off, based on the detected first erase page, and then generates a command CMD and an address ADD. The semiconductor memory device 100 resumes an interrupted program operation from the detected first erase page in response to the command CMD and the address ADD, at step S540.

In an embodiment of the present disclosure, although the detected first erase page is set as the target program page on which the interrupted program operation is to be resumed after the sudden power off has occurred, the present disclosure is not limited thereto. For example, a page subsequent to the first erase page may be set as the target program page.

In the method of operating the memory system according to an embodiment of the present disclosure, when the memory system is powered on after the sudden power off has occurred, during a read scan operation for detecting a first erase page, an erase page may be detected by only one read operation using a set read voltage. Consequently, the speed of the read scan operation may be improved.

Figure 8:
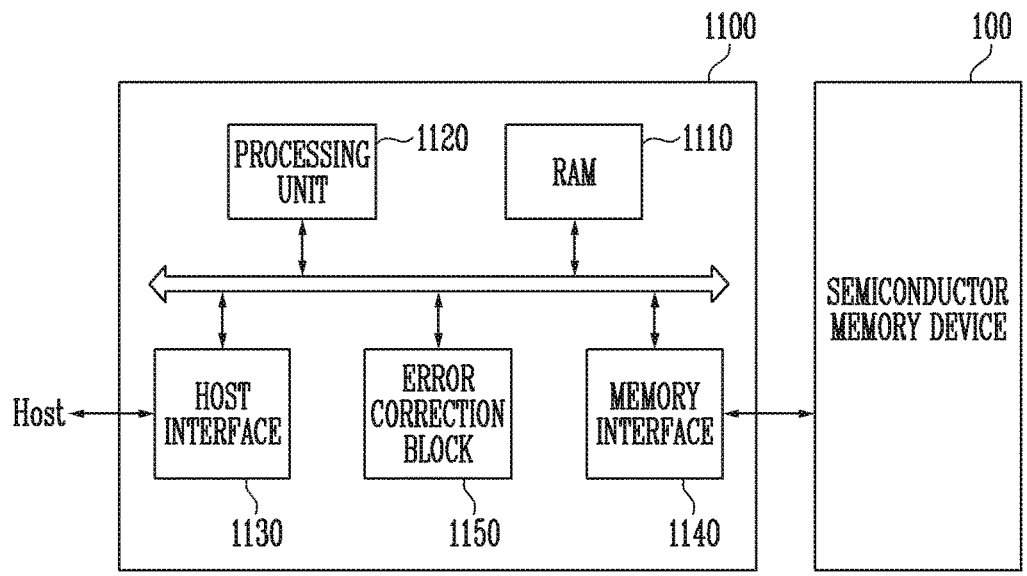
FIG. 8 is a block diagram illustrating an example of a memory system in accordance with an embodiment of the present disclosure.

FIG. 8 is a block diagram illustrating an example of a memory system 1000.

Referring to FIG. 8, the memory system 1000 includes a semiconductor memory device 100 and a controller 1100.

The semiconductor memory device 100 may have the same configuration and operation as those of the semiconductor memory device described with reference to FIG. 1. Hereinafter, repetitive explanations will be omitted.

The controller 1100 may be coupled to a host Host and the semiconductor memory device 100. The controller 1100 is configured to access the semiconductor memory device 100 in response to a request from the host Host. For example, the controller 1100 may control read, write, erase, and background operations of the semiconductor memory device 100. The controller 1100 may provide an interface between the host Host and the semiconductor memory device 100. The controller 1100 is configured to drive firmware for controlling the semiconductor memory device 100.

The controller 1100 includes a random access memory (RAM) 1110, a processing unit 1120, a host interface 1130, a memory interface 1140, and an error correction block 1150. The RAM 1110 is used as at least one of an operation memory of the processing unit 1120, a cache memory between the semiconductor memory device 100 and the host Host, and a buffer memory between the semiconductor memory device 100 and the host Host. The processing unit 1120 may include the sudden power-off sensor 201, the command and address generator 202 and the page detector 203 of FIG. 1, and control the overall operation of the controller 1100.

The host interface 1130 may include a protocol for performing data exchange between the host Host and the controller 1100. In an example of an embodiment, the controller 1100 may communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, a private protocol, and the like.

The memory interface 1140 interfaces with the semiconductor memory device 100. For example, the memory interface includes a NAND interface or a NOR interface.

The error correction block 1150 uses an error correcting code (ECC) to detect and correct an error in data received from the semiconductor memory device 100. The processing unit 1120 may adjust the read voltage according to an error detection result from the error correction block 1150, and control the semiconductor memory device 100 to perform re-reading. In an example of an embodiment, the error correction block 1150 may be provided as an element of the controller 1100.

The controller 1100 and the semiconductor memory device 100 may be integrated into a single semiconductor device. In an example of an embodiment, the controller 1100 and the semiconductor memory device 100 may be integrated into a single semiconductor device to form a memory card. For example, the controller 1100 and the semiconductor memory device 100 may be integrated into a single semiconductor device and form a memory card such as a personal computer memory card international association (PCMCIA), a compact flash card (CF), a smart media card (SM or SMC), a memory stick multimedia card (MMC, RS-MMC, or MMCmicro), a SD card (SD, miniSD, microSD, or SDHC), a universal flash storage (UFS), and the like.

The controller 1100 and the semiconductor memory device 100 may be integrated into a single semiconductor device to form a solid state drive (SSD). The SSD includes a storage device formed to store data in a semiconductor memory. When the memory system 1000 is used as the SSD, an operation speed of the host Host coupled to the memory system 1000 may be phenomenally improved.

In an embodiment, the memory system 1000 may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an embodiment, the semiconductor memory device 100 or the memory system 1000 may be embedded in various types of packages. For example, the semiconductor memory device 100 or the memory system 1000 may be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), or the like.

Figure 9:
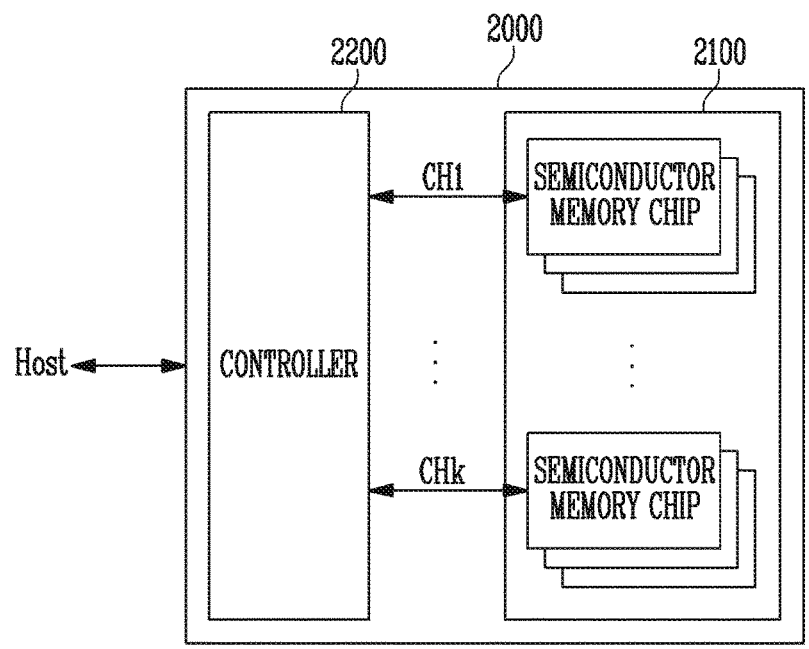
FIG. 9 is a block diagram showing an application example of the memory system of FIG. 8.

FIG. 9 is a block diagram illustrating an application example of the memory system of FIG. 8.

Referring to FIG. 9, the memory system 2000 includes a semiconductor memory device 2100 and a controller 2200. The semiconductor memory device 2100 includes a plurality of memory chips. The semiconductor memory chips are divided into a plurality of groups.

Referring to FIG. 9, it is illustrated that each of the plurality of groups communicates with the controller 2200 through first to k-th channels CH1 to CHk. Each semiconductor memory chip may have the same configuration and operation as those of an embodiment of the semiconductor memory device 100 described with reference to FIG. 1.

Each group communicates with the controller 2200 through one common channel. The controller 2200 has the same configuration as that of the controller 1100 described with reference to FIG. 8 and is configured to control a plurality of memory chips of the semiconductor memory device 2100 through the plurality of channels CH1 to CHk.

Figure 10:
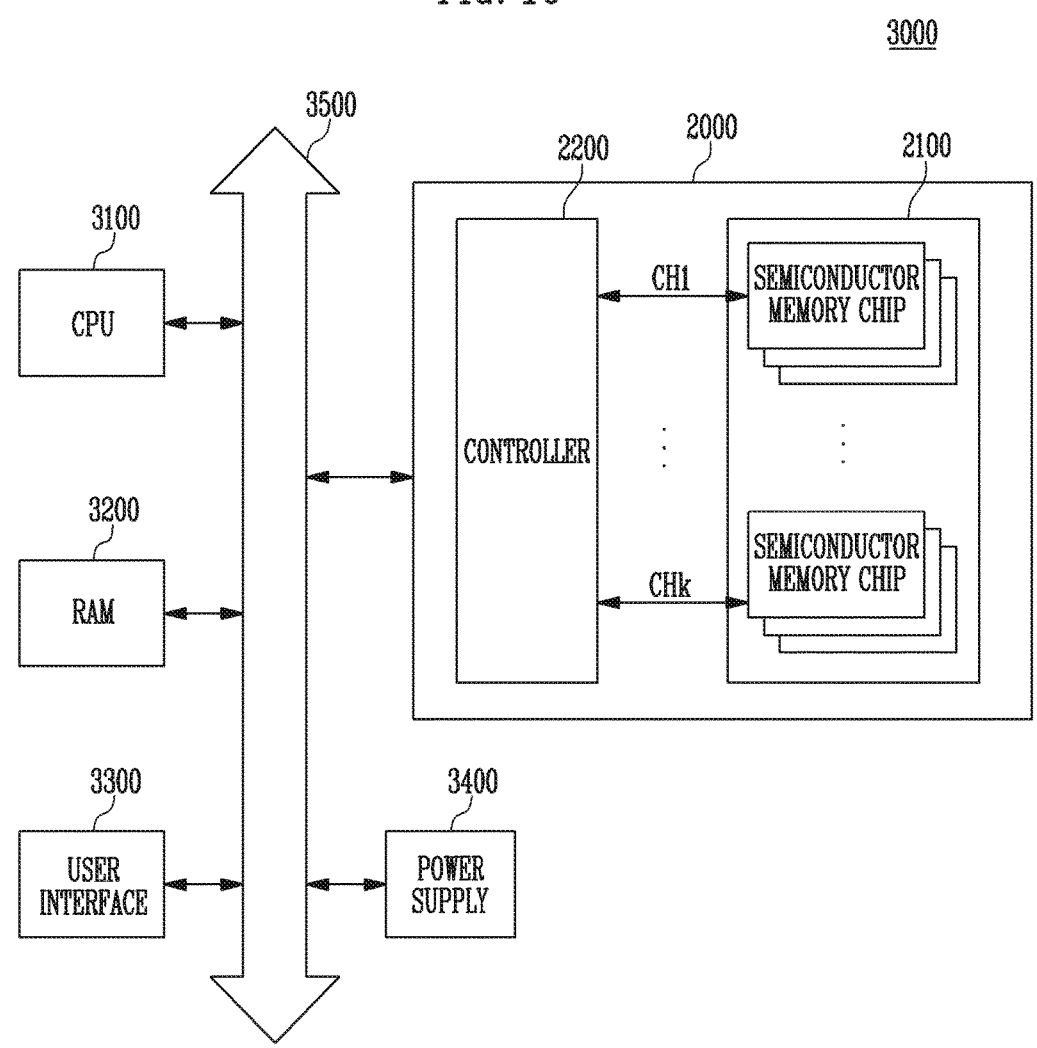
FIG. 10 is a block diagram illustrating a computing system including a memory system illustrated with reference to FIG. 9.

FIG. 10 is a block diagram illustrating a computing system 3000 including a memory system 2000 illustrated with reference to FIG. 9.

Referring to FIG. 10, the computing system 3000 may include a central processing unit 3100, a RAM 3200, a user interface 3300, a power supply 3400, a system bus 3500, and a memory system 2000.

The memory system 2000 is electrically coupled to the CPU 3100, the RAM 3200, the user interface 3300, and the power supply 3400 through the system bus 3500. Data provided through the user interface 3300 or processed by the CPU 3100 is stored in the memory system 2000.

Referring to FIG. 10, the semiconductor memory device 2100 is illustrated as being coupled to the system bus 3500 through the controller 2200. However, the semiconductor memory device 2100 may be directly coupled to the system bus 3500. The function of the controller 2200 may be performed by the CPU 3100 and the RAM 3200.

Referring to FIG. 10, the memory system 2000 described with reference to FIG. 9 may be provided. However, the memory system 2000 may be replaced with the memory system 1000 described with reference to FIG. 8. In an embodiment, the computing system 3000 may include all of the memory systems 1000 and 2000 described with reference to FIGS. 8 and 9.

According to the present disclosure, when the memory system is re-powered on after sudden power-off of the memory system has occurred, an erase page is searched for by only one read operation using a set read voltage. Consequently, an operation speed of the memory system may be improved.

Exemplary embodiments have been disclosed herein, and although specific terms are employed, they are used and are to be interpreted in a generic and descriptive sense only and are not intended to be limiting. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those skilled in the art that various changes in form and details may be made without departing from the spirit and scope of the present disclosure as set forth in the following claims.

What is claimed is:

1. A memory system comprising:
   a controller configured to generate and output a first command for a program operation in response to a request from a host, and generate and output a second command for a read scan operation when the memory system is powered on after an abnormal power-off is detected; and
   a semiconductor memory device configured to perform the program operation on a page basis in response to the first command, perform the read scan operation in response to the second command, and perform a single read operation per page using a set read voltage during the read scan operation,
   wherein the set read voltage is a median voltage between two adjacent threshold voltage distributions corresponding to program states distributed in a middle of all program states programmed into the semiconductor memory device during the program operation.

2. The memory system according to claim 1, wherein the controller comprises:
   a sudden power-off sensor configured to detect the abnormal power-off;
   a command and address generator configured to generate the first command and an address in response to the request from the host, and generate the second command and the address in response to a detection signal of the sudden power-off sensor; and
   a page detector configured to detect a first erase page in response to data read during the read scan operation.

3. The memory system according to claim 2, wherein the command and address generator generates a third command and the address such that the program operation interrupted during the abnormal power-off is resumed from the first erase page detected by the page detector.

4. The memory system according to claim 2, wherein the command and address generator generates a third command and the address such that the program operation interrupted during the abnormal power-off is resumed from an erase page subsequent to the first erase page detected by the page detector.

5. The memory system according to claim 2, wherein when a number of erase data corresponding to an erase cell and included in the data read on the page basis during the read scan operation is a preset value or more, the page detector detects a corresponding page as an erase page.

6. The memory system according to claim 1,
   wherein the semiconductor memory device comprises:
   a memory cell array comprising a plurality of memory blocks configured with a plurality of pages; and
   a peripheral circuit configured to perform the program operation in response to the first command, and
   wherein the peripheral circuit receives randomized data input from the controller during the program operation, and programs the randomized data to a selected memory block of the memory blocks on the page basis.

7. The memory system according to claim 6, wherein the peripheral circuit programs, into first to n-th program states, memory cells included in selected pages during the program operation on the page basis such that the memory cells of the first to n-th program states are evenly distributed.

8. The memory system according to claim 7,
   wherein the peripheral circuit successively performs a read operation, on the page basis, on the pages included in the selected memory block during the read scan operation.

9. A memory system comprising:
   a semiconductor memory device configured to perform a program operation on a page basis in response to a first command, and perform a read scan operation in response to a second command when the memory system is powered on after an abnormal power-off;
   a sudden power-off sensor configured to sense the abnormal power-off and the power-on; and
   a command generator configured to generate and output the first command for the program operation in response to a request from a host, and generate and output the second command when the power-on is sensed by the sudden power-off sensor after the abnormal power-off, wherein the semiconductor memory device performs the read scan operation using a set read voltage, and wherein the set read voltage is a median voltage between two adjacent threshold voltage distributions corresponding to program states distributed in a middle of all program states programmed into the semiconductor memory device during the program operation.

10. The memory system according to claim 9, further comprising:

a page detector configured to detect a first erase page of a selected memory block included in the semiconductor memory device depending on data read during the read scan operation of the semiconductor memory device.

11. The memory system according to claim 10, wherein the command generator generates a third command such that, after the read scan operation, the program operation interrupted during the abnormal power-off is resumed from the first erase page detected by the page detector.

12. The memory system according to claim 10, wherein the command generator generates a third command such that, after the read scan operation, the program operation interrupted during the abnormal power-off is resumed from an erase page subsequent to the first erase page detected by the page detector.

13. The memory system according to claim 10, wherein when a number of erase data corresponding to an erase cell and included in the data read during the read scan operation is a preset value or more, the page detector detects a corresponding page as an erase page.

14. The memory system according to claim 9, wherein the semiconductor memory device comprises:

a memory cell array comprising a plurality of memory blocks configured with a plurality of pages; and a peripheral circuit configured to perform the program operation in response to the first command, and wherein the peripheral circuit receives randomized data input from the controller during the program operation, and programs the randomized data to a selected memory block of the memory blocks on a page basis.

15. The memory system according to claim 14, wherein the peripheral circuit programs memory cells included in selected pages during the program operation on the page basis into first to n-th program states such that the memory cells of the first to n-th program states are evenly distributed.

16. The memory system according to claim 15, wherein the peripheral circuit successively performs a read operation, on the page basis, on the pages included in the selected memory block during the read scan operation.

17. A method of operating a memory system, comprising:

programming random data to a selected memory block on a page basis;

performing a read scan operation when the memory system is powered on after a sudden power-off is sensed, the read scan operation comprising searching for a first erase page of pages of the selected memory block using a set read voltage; and re-performing, from the searched first erase page, the programming interrupted when the sudden power-off occurred, wherein the pages are programmed into first to n-th program states, and wherein the set read voltage is a median voltage between two adjacent threshold voltage distributions corresponding to program states distributed in a middle of the first to n-th program states.

18. The method according to claim 17, wherein the programming comprises successively selecting the pages included in the selected memory block and programming the random data to the selected pages on the page basis.

19. The method according to claim 17, wherein that the memory cells of the first to n-th program states are evenly distributed.

* * * * *